US006826049B2

United States Patent
Chen

(10) Patent No.: US 6,826,049 B2
(45) Date of Patent: Nov. 30, 2004

(54) HEAT SINK ASSEMBLY WITH FAN-DRIVEN FLUID CIRCULATION

(75) Inventor: Yun Lung Chen, Tu-chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 57 days.

(21) Appl. No.: 10/421,228

(22) Filed: Apr. 22, 2003

(65) Prior Publication Data

US 2004/0035560 A1 Feb. 26, 2004

(30) Foreign Application Priority Data

Aug. 20, 2002 (TW) ....................................... 91212915 U

(51) Int. Cl.[7] ................................................ H05K 7/20
(52) U.S. Cl. ................. 361/697; 165/80.4; 165/104.33; 165/121; 361/699; 361/700
(58) Field of Search ............................. 165/80.3, 80.4, 165/121, 104.33; 361/697–703

(56) References Cited

U.S. PATENT DOCUMENTS 6,019,165 A * 2/2000 Batchelder ................. 165/80.3
6,327,145 B1 * 12/2001 Lian et al. .................. 361/697
6,507,492 B2 * 1/2003 Morris et al. ............... 361/698
6,600,649 B1 * 7/2003 Tsai et al. ................... 361/697
6,702,002 B2 * 3/2004 Wang ........................ 165/80.3
6,749,012 B2 * 6/2004 Gwin et al. ................ 165/80.4

FOREIGN PATENT DOCUMENTS

CN 2371768 Y 3/2000

* cited by examiner

Primary Examiner—Gregory D. Thompson
(74) Attorney, Agent, or Firm—Wei Te Chung

(57) ABSTRACT

A heat sink assembly for dissipating heat from a CPU (3) includes a computer enclosure (2), a heat sink (10), a container (20), a fan (30), and a tube (40). The container is partly filled with liquid, and is mounted on the heat sink. The fan is mounted in the container and open to a top wall (22) of the container. The enclosure encloses the heat sink the container and the fan therein. The tube is attached to the enclosure, with one end of the tube inserted through the container and engaged with a side of the fan, and an opposite end of the tube engaged with the container. In operation, liquid rises as vapor to the top wall, and condenses into droplets which drop into the fan. The droplets received in the fan are impelled to enter the tube, transfer heat to the enclosure, and return to the container.

17 Claims, 4 Drawing Sheets

HEAT SINK ASSEMBLY WITH FAN-DRIVEN FLUID CIRCULATION

BACKGROUND OF THE INVENTION

1. Field of the Invention

The present invention relates to heat sink assemblies, and more particularly to a heat sink assembly for rapidly removing heat from an electronic device such as a central processing unit (CPU).

2. Description of Prior Art

During operating of an electronic device such as a computer central processing unit (CPU), a large amount of heat is often produced. The heat must be quickly removed from the CPU to prevent it from becoming unstable or being damaged. Typically, a heat sink is attached to an outer surface of the CPU to facilitate removal of heat therefrom A conventional heat sink is usually integrally formed by extrusion, and comprises a base and a plurality of fins extending integrally from the base. However, because the heat sink is formed by extrusion, a height of the fins is limited to a relatively low height. In many applications, the fins of the heat sink are not high enough to dissipate heat generated by the corresponding electronic device such as a high-speed central processing unit (CPU). Furthermore, even when extrusion provides fins that are sufficiently high, such fins are liable to sustain large leveraging forces when the heat sink is attached to other components. As a result, the risk of damage to the fins is increased, and it is inconvenient to attempt to attach the heat sink with extra care. In summary, limited height of fins and their susceptibility to damage are two common problems inherent in conventional extruded heat sinks.

An improved heat sink assembly is desired to overcome the above-described disadvantages of the related art.

SUMMARY OF THE INVENTION

Accordingly, an object of the present invention is to provide a heat sink assembly which cooperates with a computer enclosure to dissipate heat generated by a device such as a central processing unit (CPU) of the computer.

Another object of the present invention is to provide a heat sink assembly which has excellent heat dissipation efficiency.

In order to achieve the objects set out above, a heat sink assembly for dissipating heat generated by a CPU in accordance with a preferred embodiment of the present invention comprises a computer enclosure, a heat sink a container, a fan and a tube. The container is partly filled with liquid and mounted on the heat sink. The fan is mounted in the container and open to a top wall of the container. The enclosure encloses the heat sink, the container, the fan and the tube therein. A medial portion of the tube is attached to the enclosure, an end of the tube is inserted through one side of the container and engaged in a side of the fan, and an opposite end of the tube is engaged in an opposite side of the container. In operation, the heat sink absorbs heat from the CPU and transfers heat to the container. Liquid in the container changes into high temperature vapor, rises to the top wall, turns into high temperature liquid droplets, and falls down toward the liquid. A proportion of the high temperature liquid droplets are received in the fan, and impelled by the fan to enter the tube. The high temperature liquid droplets transfer heat to the enclosure at the medial portion of the tube, and change into low temperature liquid droplets that return to the container.

Other objects, advantages and novel features of the present invention will become more apparent from the following detailed description when taken in conjunction with the accompanying drawings, in which:

DETAILED DESCRIPTION OF THE INVENTION

Figure 1:
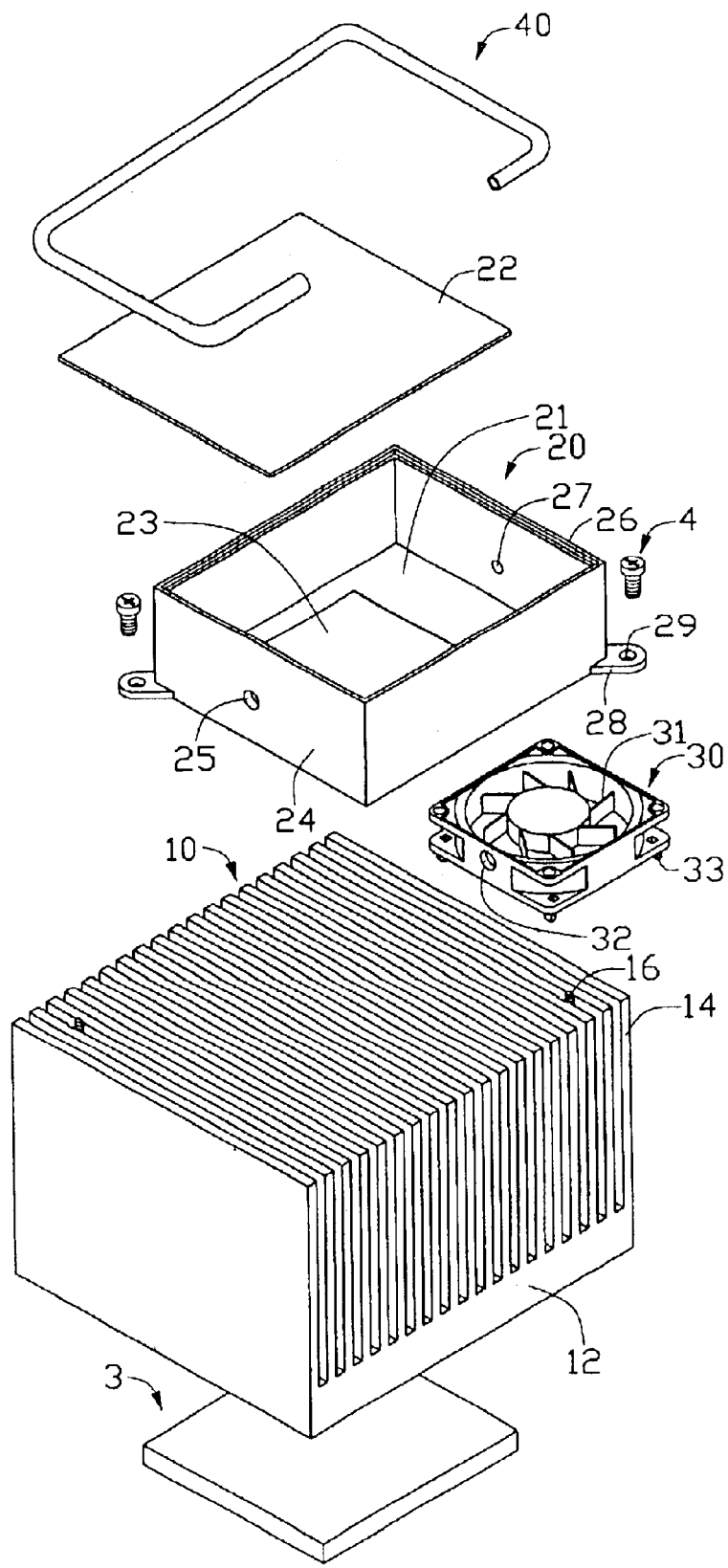
FIG. 1 is an exploded, isometric view of a heat sink assembly of the present invention, together with a CPU.

Reference will now be made to the drawing figures to described the present invention in detail.

Figure 2:
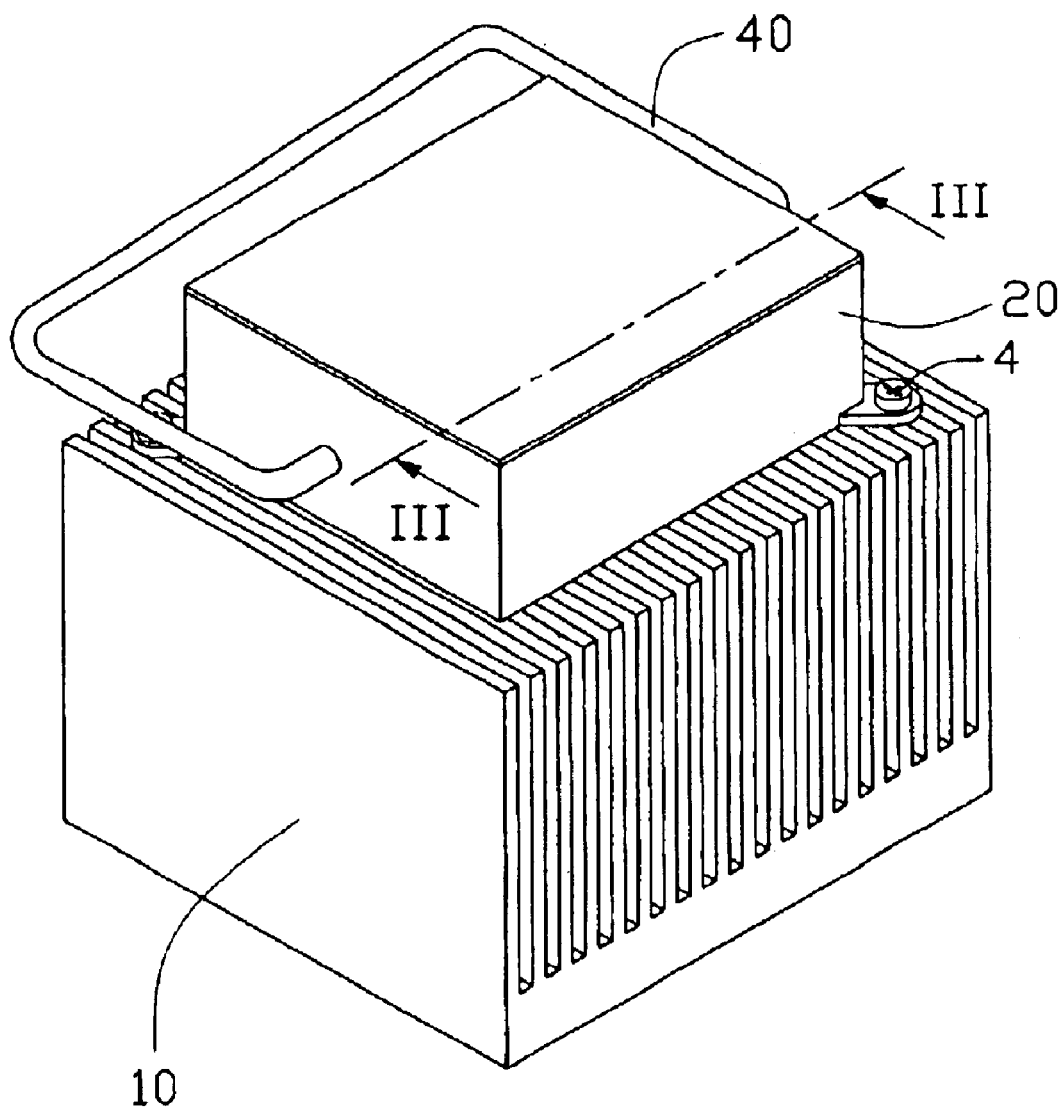
FIG. 2 is an assembled view of the heat sink assembly and CPU of FIG. 1.
Figure 3:
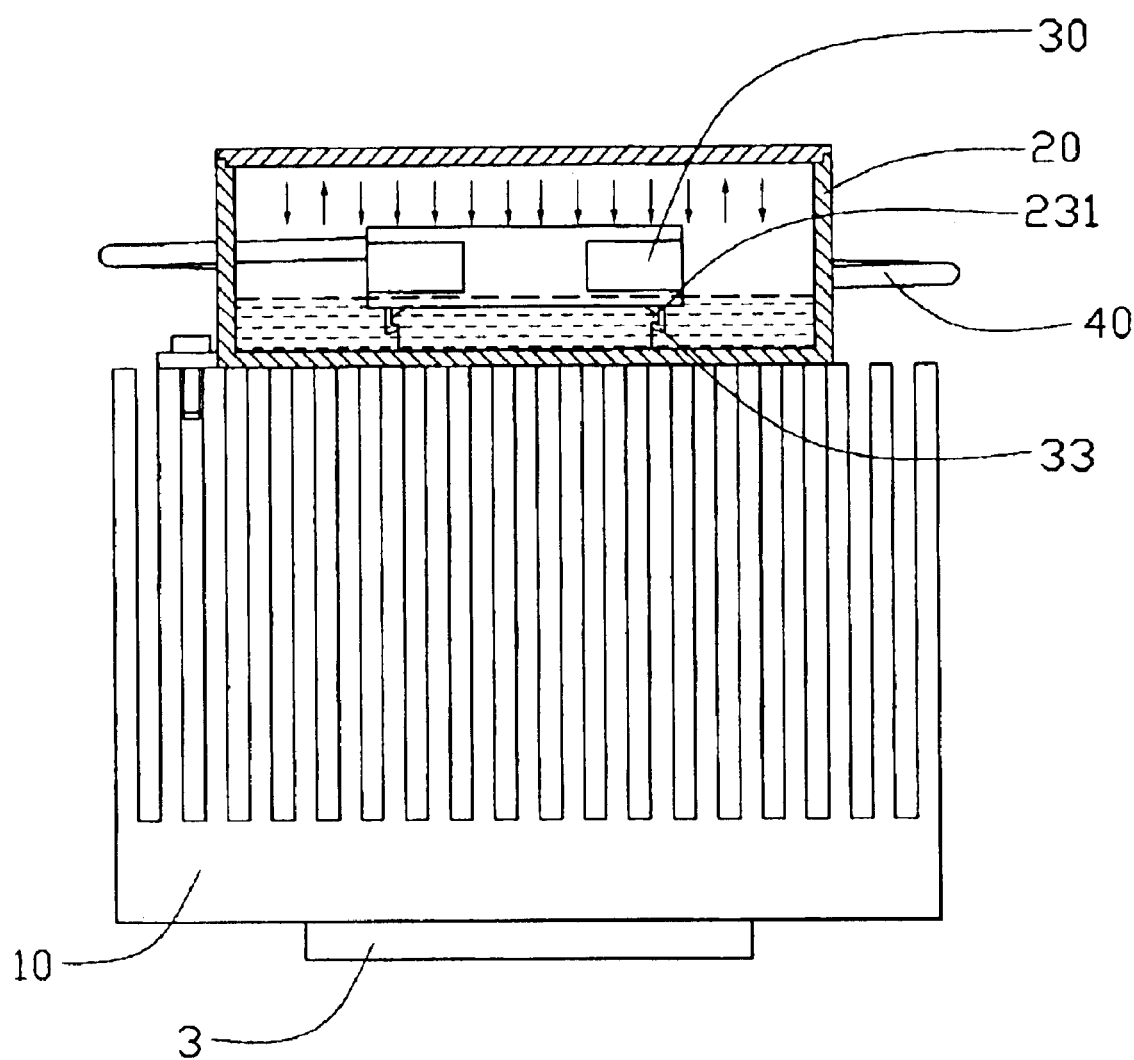
FIG. 3 is a schematic cross-sectional view taken along line III—III of FIG. 2.
Figure 4:
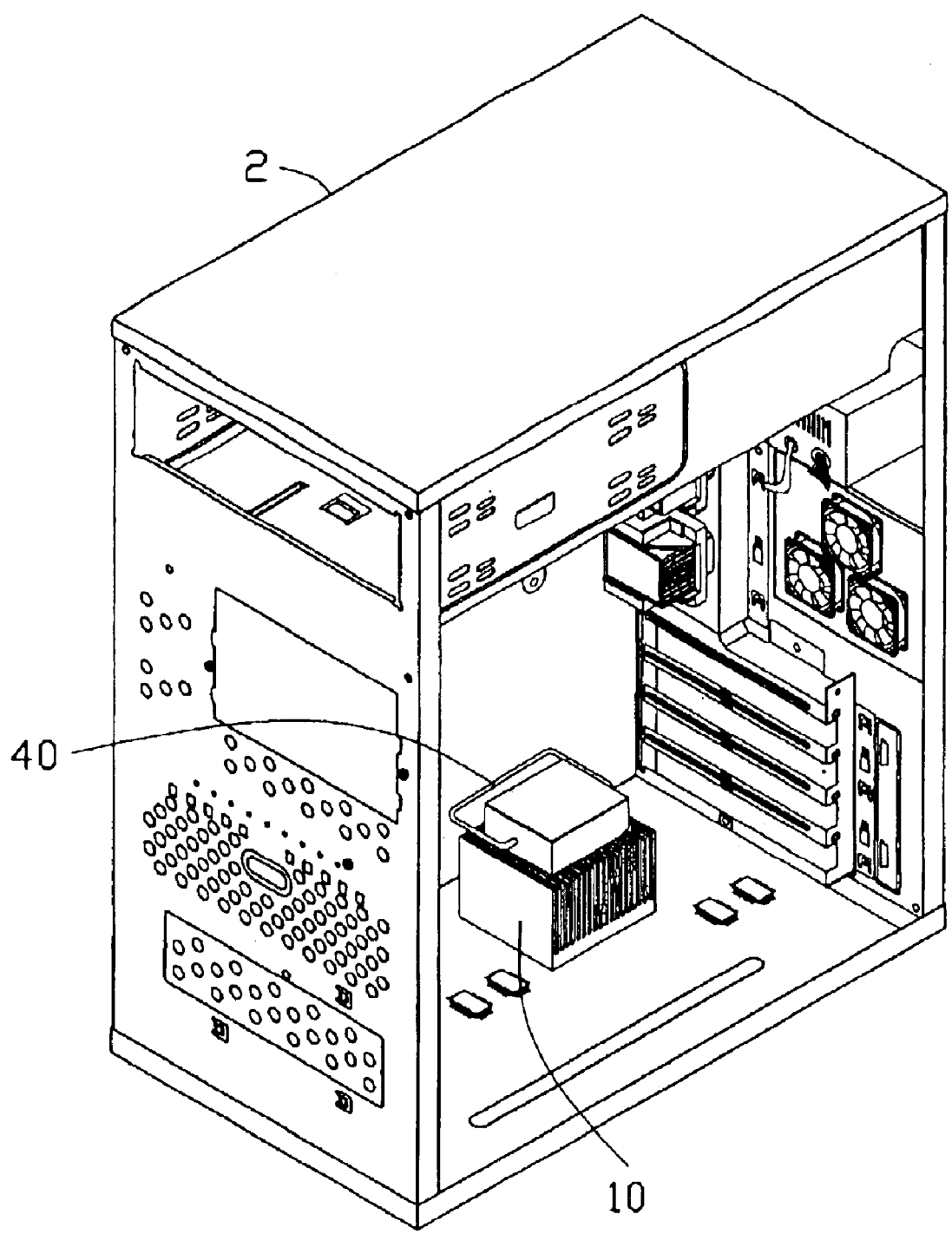
FIG. 4 is an isometric view of the heat sink assembly and CPU of FIG. 2 attached into a computer enclosure.

Referring to FIG. 1–4, a heat sink assembly in accordance with the preferred embodiment of the present invention cooperates with a computer enclosure 2 to dissipate heat generated by a central processing unit (CPU) 3 of the computer. The heat sink assembly comprises a heat sink 10, a container 20, a fan 30, and a tube 40 attached to the enclosure 2.

The heat sink 10 comprises a base 12 mounted on the CPU 3 of the computer, and a plurality of parallel fins 14 extending upwardly from the base 12. A shallow screw hole 16 is defined between top portions of two adjacent fins 14 at each of two diagonally opposite corners of the plurality of parallel fins 14.

The container 20 has a bottom wall 21, and a detachable top wall 22. A platform 23 protrudes upwardly from a central surface of the bottom wall 21. A pair of flanges 231 extends from opposite upper edges of the platform 23 respectively. The container 20 comprises two opposite side walls 24, 26. The side wall 24 defines a through hole 25 therein, and the side wall 26 defines an inlet 27 therein which is disposed lower than the through hole 25. An ear 28 extends from a bottom of each of two diagonally opposite corners of the container 20. Each ear 28 defines an inserting hole 29. Two fasteners such as bolts 4 are insertable through the corresponding inserting holes 29 to engage in the screw holes 16 of the heat sink 10, thereby mounting the container 20 to the heat sink 10. The container 20 is partly filled with liquid such as water or alcohol, and contains air at a pressure below room pressure. The inlet 27 of the container 20 is disposed above the liquid.

The fan 30 has an open top, which exposes a plurality of internal radial blades 31 of the fan 30. One side surface of the fan 30 defines an outlet 32. The outlet 32 corresponds to the through hole 25 of the container 20, and is disposed slightly higher than the through hole 25. A hook 33 depends from each of four corners of a bottom surface of the fan 30, for engaging with the flanges 231 of the platform 23 of the container 20 and thereby mounting the fan 30 on the platform 23 of the container 20.

In assembly, the heat sink 10 is mounted on the CPU 3. The container 20 is placed on the heat sink 10. The bolts 4 are inserted through the inserting holes 29 of the container 20 and engaged in the screw holes 16 of the heat sink 10, thereby mounting the container 20 on top of the fins 14 of the heat sink 10. The fan 30 is placed on the platform 23. The hooks 32 of the fan 30 are snappingly engaged with the flanges 231 of the platform 23, thereby fastening the fan 30 on the platform 23. The top wall 22 is attached on the container 20 such that the container 20 is sealed below room pressure. A medial portion of the tube 40 is attached to the enclosure 2. One end of the tube 40 is inserted through the through hole 25 of the container 20 and engaged in the outlet 32 of the fan 30. An opposite end of the tube 40 is engaged in the inlet 27 of the container 20. Thus, a circular route is defined in the heat sink assembly for the liquid to travel through.

In operation of the heat sink assembly, the base 12 of the heat sink 10 absorbs heat generated by the CPU 3, and transfers heat to the container 20 through the fins 14. Liquid in the container 20 absorbs the transferred heat and turns into high temperature vapor. The high temperature vapor rises and contacts the top wall 22 of the container 20, and turns into high temperature liquid droplets. The high temperature liquid droplets then fall down toward the liquid. In addition, the blades 31 of the fan 30 rotate and drive a proportion of the high temperature liquid droplets to flow out through the outlet 32 of the fan 30. The high temperature liquid droplets pass through the medial portion of the tube 40 that is attached to the enclosure 2, and the enclosure 2 absorbs heat from the high temperature liquid droplets and dissipates the absorbed heat. Thus the high temperature liquid droplets turn into low temperature liquid droplets, which flow through the inlet 27 back into the container 20. By the above-described cyclical operations, the heat sink assembly can efficiently dissipate the heat generated by the CPU 3.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat sink assembly comprising:
   a heat sink;
   a container mounted on the heat sink, the container defining a through hole and an inlet lower than the through hole, the container receiving liquid therein, the liquid being disposed below the through hole;
   a fan mounted in the container, the fan comprising a plurality of blades and an outlet higher than the through hole; and
   a tube having one end thereof inserted through the through hole and engaging in the outlet of the fan, and an opposite end thereof engaging in the inlet of the container.

2. The heat sink assembly of claim 1, wherein a pair of ears extends from two diagonally opposite corners of the container respectively, for mounting the container to the heat sink.

3. The heat sink assembly of claim 2, wherein each of the ears defines an inserting hole, and a pair of screw holes is defined in a top portion of the heat sink corresponding to the inserting holes, for insertion of a pair of fasteners therethrough.

4. The heat sink assembly of claim 1, further comprising a computer enclosure.

5. The heat sink assembly of claim 4, wherein the tube contacts the computer enclosure.

6. The heat sink assembly of claim 1, wherein the fan is open at a top thereof to expose the blades of the fan to a top wall of the container.

7. The heat sink assembly of claim 1, wherein a platform protrudes from a bottom wall of the container, the platform supporting the fan thereon.

8. The heat sink assembly of claim 7, wherein a pair of flanges extends from opposite sides of the platform respectively, and hooks depend from the fan and snappingly engage with the flanges.

9. A computer system, comprising:
   a heat generating device;
   a container with liquid therein mounted on the heat generating device;
   a fan mounted in the container and open to a top wall of the container for receiving liquid droplets from the top wall;
   a computer enclosure containing the heat generating device, the container and the fan therein; and
   a tube attached to the enclosure, the tube having one end thereof inserted through the container and engaged with the fan, and an opposite end thereof engaged with the container, wherein the liquid droplets received in the fan are impelled by the fan to enter the tube, transfer heat to the enclosure, and return to the container.

10. The computer system of claim 9, wherein the heat generating device comprises an electronic package and a heat sink mounted on the electronic package.

11. The computer system of claim 10, wherein the container is mounted on the heat sink.

12. The heat sink assembly of claim 9, wherein a platform protrudes from a bottom wall of the container, the platform supporting the fan thereon.

13. The heat sink assembly of claim 12, wherein a pair of flanges extends from opposite sides of the platform respectively, and wherein hooks depend from the fan and snappingly engage with the flanges.

14. A method of transferring heat, comprising steps of:
   providing a heat sink with a container in an intimate relation;
   providing said container with coolant therein;
   providing a fan in the container; and
   providing a tube outside of the container with first and second ends connected to the container and therebetween a medium portion contacting an enclosure of a computer; wherein
   the coolant is heated by said heat sink to be vaporized and successively cooled and liquidized by said fan to enter the first end, travel the medium portion and be back to the container from the second end for forming a circulation system.

15. The method of claim 14, wherein both said first and second ends are located above a liquid level of said coolant.

16. The method of claim 14, wherein said first end is further connected to the fan.

17. The method of claim 14, wherein said container is located on fins of the heat sink.

* * * * *